US 12,381,390 B2

(12) United States Patent
Hu et al.

(10) Patent No.: US 12,381,390 B2
(45) Date of Patent: Aug. 5, 2025

(54) SINGLE-PHASE-TO-GROUND PROTECTION METHOD AND SYSTEM FOR ACTIVE POWER DISTRIBUTION NETWORK (71) Applicant: Nanjing Sac Power Grid Automation Co., Ltd, Nanjing (CN)

(72) Inventors: Bing Hu, Nanjing (CN); Fufeng Chen, Nanjing (CN); Mingjun Xue, Nanjing (CN); Dong Chen, Nanjing (CN); Yinian Qi, Nanjing (CN); Yuping Li, Nanjing (CN); Yuwen Liang, Nanjing (CN); Dong Yang, Nanjing (CN)

(73) Assignee: Nanjing Sac Power Grid Automation Co., Ltd, Nanjing (CN)

( * ) Notice: Subject to any disclaimer, the term of this patent is extended or adjusted under 35 U.S.C. 154(b) by 0 days.

(21) Appl. No.: 18/820,212

(22) Filed: Aug. 29, 2024

(65) Prior Publication Data
US 2025/0079833 A1 Mar. 6, 2025

(30) Foreign Application Priority Data
Aug. 29, 2023 (CN) .......................... 202311105236.7

(51) Int. Cl.
H02J 3/00 (2006.01)
G01R 31/52 (2020.01)
G01R 31/58 (2020.01)

(52) U.S. Cl.
CPC .......... *H02J 3/00125* (2020.01); *G01R 31/52* (2020.01); *G01R 31/58* (2020.01); *H02J 3/0012* (2020.01)

(58) Field of Classification Search
CPC .... H02J 3/0012; H02J 3/00125; G01R 31/52; G01R 31/58
USPC .......................................................... 307/326
See application file for complete search history.

(56) References Cited

FOREIGN PATENT DOCUMENTS

| CN | 104330979 A | 2/2015 |
|----|-------------|--------|
| CN | 106199341 A | 12/2016 |
| CN | 115459229 A | 12/2022 |

*Primary Examiner* — Hal Kaplan
(74) *Attorney, Agent, or Firm* — Nitin Kaushik (57) ABSTRACT

Disclosed are a single-phase-to-ground protection method and system for an active power distribution network. The method includes: acquiring current and voltage data of a line in real time by means of a power distribution terminal, and calculating active power of the line; recording and storing the active power of the line to form an active power curve; performing data statistics according to the active power curve; calculating a direction compensation coefficient and a zero-sequence current compensation coefficient on the basis of statistical data; and detecting whether a single-phase-to-ground fault occurs to the line, where when the single-phase-to-ground fault occurs to the line, a transient-state zero-sequence direction and a steady-state zero-sequence direction are compensated, or a zero-sequence current is compensated, it is determined that the single-phase-to-ground fault occurs to the line when compensation results satisfy action conditions, and tripping is performed or an alarm is given.

16 Claims, 2 Drawing Sheets

FIG. 1

FIG. 2

SINGLE-PHASE-TO-GROUND PROTECTION METHOD AND SYSTEM FOR ACTIVE POWER DISTRIBUTION NETWORK

CROSS-REFERENCE TO RELATED APPLICATIONS

The application claims priority to Chinese patent application No. 2023111052367, filed on Aug. 29, 2023, the entire contents of which are incorporated herein by reference.

TECHNICAL FIELD

The present disclosure relates to the technical field of relay protection of a power system, and in particular to a single-phase-to-ground protection method and system for an active power distribution network.

BACKGROUND

For a power distribution network, a network frame has a complex structure, an operation mode is changeable, and a neutral point grounding mode is diverse. Moreover, access of a large number of distributed power supplies to the power distribution network in recent years leads to insufficient adaptability of single-phase-to-ground protection.

To solve the single-phase-to-ground fault isolation problem of a small current grounding system, a power company requires a power distribution terminal to have a small current ground protection function. This protection function generally adopts a transient-state or steady-state zero-sequence power direction principle, which is based on a zero-sequence current and voltage direction. The operation mode of the distribution network often changes, and the change of the operation mode will change the main power supply of lines, thereby affecting a positive direction of an action of single-phase-to-ground protection. In order to adapt to the change of the operation mode, the single-phase-to-ground protection system can automatically adjust the positive direction or zero-sequence current polarity of the action of the single-phase-to-ground protection according to a power flow direction. When large-scale distributed power supplies are connected, the power flow direction of the lines may be reversed, which will cause an incorrect action of the single-phase-to-ground protection. A traditional solution does not adapt to access of high-proportion distributed power supplies, accuracy of the single-phase-to-ground protection is low, and demands of building an active power distribution network fail to be satisfied.

SUMMARY

An objective of the present disclosure is to provide a single-phase-to-ground protection method and system for an active power distribution network, so as to solve at least one of the technical problems in the background art.

In order to achieve the above objective, the present disclosure provides a single-phase-to-ground protection method for an active power distribution network. The method includes the following steps:

acquiring a three-phase voltage, a three-phase current, a zero-sequence voltage and a zero-sequence current of a line in real time by means of a power distribution terminal, and calculating active power P of the line;

recording and storing the active power of the line at a fixed time interval $T_{smp}$ to form an active power curve $P_i$;

performing data statistics according to the active power curve, where statistical data include average daily active power, average night active power, all-day positive active time, all-day reverse active time, night positive active time and night reverse active time;

calculating a single-phase-to-ground protection action direction compensation coefficient $D_p$ and a zero-sequence current compensation coefficient $k_{i0}$ on the basis of the statistical data; and detecting whether a single-phase-to-ground fault occurs to the line, where when the single-phase-to-ground fault occurs to the line, a transient-state zero-sequence direction and a steady-state zero-sequence direction are compensated by using the single-phase-to-ground protection action direction compensation coefficient $D_p$, or the zero-sequence current is compensated by using the zero-sequence current compensation coefficient $k_{i0}$, it is determined that the single-phase-to-ground fault occurs to the line when compensation results satisfy action conditions of the single-phase-to-ground protection, and the power distribution terminal trips or gives an alarm after delay.

Based on one aspect of the present disclosure, whether a single-phase-to-ground fault occurs to the line is detected, when the single-phase-to-ground fault occurs to the line, a transient-state zero-sequence direction and a steady-state zero-sequence direction are calculated on the basis of the zero-sequence voltage and the zero-sequence current, and a transient-state zero-sequence direction and a steady-state zero-sequence direction are compensated by using the single-phase-to-ground protection action direction compensation coefficient $D_p$. When the compensated zero-sequence power direction satisfies the action conditions of the single-phase-to-ground protection, it is determined that the single-phase-to-ground fault occurs to the line, and the power distribution terminal trips or gives an alarm after delay.

Based on one aspect of the present disclosure, the single-phase-to-ground protection action direction compensation coefficient $D_p$ is the average daily active power $P_{av}$ of the line:

$$D_P = P_{av} = \frac{1}{N}\sum_{i=1}^{N} P_i$$

In the formula, N is the number of active power curve points recorded by the power distribution terminal within 24 hours.

Based on one aspect of the present disclosure, the single-phase-to-ground protection action direction compensation coefficient $D_p$ is the average night active power $P_{av\_n}$ of the line:

$$D_P = P_{av\_n} = \frac{1}{k2-k1}\sum_{i=k1}^{k2} P_i$$

In the formula, k1 is a night start point of the active power curve, and k2 is a night end point of the active power curve.

Based on one aspect of the present disclosure, the single-phase-to-ground protection action direction compensation coefficient $D_p$ is a difference between the all-day positive active time and the all-day reverse active time:

$$D_P = T_{smp} * \left( \sum_{i=1}^{N}(P_i > 0) - \sum_{i=1}^{N}(P_i < 0) \right).$$

Based on one aspect of the present disclosure, the single-phase-to-ground protection action direction compensation coefficient $D_p$ is a difference between the night positive active time and the night reverse active time:

$$D_P = T_{smp} * \left( \sum_{i=k1}^{k2}(P_i > 0) - \sum_{i=k1}^{k2}(P_i < 0) \right).$$

Based on one aspect of the present disclosure, the action conditions of the single-phase-to-ground protection are: the compensated transient-state zero-sequence power direction or the steady-state zero-sequence power direction is positive, and at least one of the following formulas is satisfied:

$$\begin{cases} D_p * \int_0^{tz} i_0 * u_0 > 0 \\ D_p * \cos\dfrac{\dot{U}_0}{\dot{I}_0} > 0 \end{cases}.$$

In the formulas, tz is a transient-state duration of the single-phase-to-ground fault, taking 2 ms, $i_0$ is a zero-sequence current sampling value, $u_0$ is a zero-sequence voltage sampling value, $\dot{I}_0$ is a zero-sequence current vector, and $\dot{U}_0$ is a zero-sequence voltage vector.

Based on one aspect of the present disclosure, whether a single-phase-to-ground fault occurs to the line is detected, when the single-phase-to-ground fault occurs to the line, the zero-sequence current is compensated according to the zero-sequence current compensation coefficient $k_{i0}$, and the transient-state zero-sequence power and steady-state zero-sequence reactive power are calculated on the basis of the compensated zero-sequence current and zero-sequence voltage. When the transient-state zero-sequence power or the steady-state zero-sequence reactive power is greater than zero, it is determined that the single-phase-to-ground fault occurs to the line, and the power distribution terminal trips or gives an alarm after delay.

Based on one aspect of the present disclosure, when the average daily active power of the line is negative, the zero-sequence current compensation coefficient $k_{i0}$ takes a value of −1, otherwise, the zero-sequence current compensation coefficient $k_{i0}$ takes a value of 1:

$$k_{i0} = \begin{cases} 1, \dfrac{1}{N}\sum_{i=1}^{N} P_i > 0 \\ -1, \dfrac{1}{N}\sum_{i=1}^{N} P_i < 0 \end{cases}.$$

In the formula, N is the number of active power curve points recorded by the power distribution terminal within 24 hours.

Based on one aspect of the present disclosure, when the average night active power of the line is negative, the zero-sequence current compensation coefficient $k_{i0}$ takes a value of −1, otherwise, the zero-sequence current compensation coefficient $k_{i0}$ takes a value of 1:

$$k_{i0} = \begin{cases} 1, \dfrac{1}{k2-k1}\sum_{i=k1}^{k2} P_i > 0 \\ -1, \dfrac{1}{k2-k1}\sum_{i=k1}^{k2} P_i < 0 \end{cases}.$$

In the formula, k1 is a night start point of the active power curve, and k2 is a night end point of the active power curve.

Based on one aspect of the present disclosure, when the all-day reverse active time is greater than the all-day positive active time, the zero-sequence current compensation coefficient $k_{i0}$ takes a value of −1, otherwise, the zero-sequence current compensation coefficient $k_{i0}$ takes a value of 1:

$$k_{i0} = \begin{cases} 1, \sum_{i=1}^{N}(P_i > 0) > \sum_{i=1}^{N}(P_i < 0) \\ -1, \sum_{i=1}^{N}(P_i > 0) < \sum_{i=1}^{N}(P_i < 0) \end{cases}.$$

Based on one aspect of the present disclosure, when the night reverse active time is greater than the night positive active time, the zero-sequence current compensation coefficient $k_{i0}$ takes a value of −1, otherwise, the zero-sequence current compensation coefficient $k_{i0}$ takes a value of 1:

$$k_{i0} = \begin{cases} 1, \sum_{i=k1}^{k2}(P_i > 0) > \sum_{i=k1}^{k2}(P_i < 0) \\ -1, \sum_{i=k1}^{k2}(P_i > 0) < \sum_{i=k1}^{k2}(P_i < 0) \end{cases}.$$

In the formula, k1 is a night start point of the active power curve, and k2 is a night end point of the active power curve.

Based on one aspect of the present disclosure, the action conditions of the single-phase-to-ground protection are: the transient-state zero-sequence power or the steady-state zero-sequence reactive power calculated on the basis of the compensated zero-sequence current and zero-sequence voltage is greater than zero, and at least one of the following formulas is satisfied:

$$\begin{cases} \int_0^{tz} k_{i0} * i_0 * u_0 > 0 \\ \cos\dfrac{\dot{U}_0}{k_{i0} * \dot{I}_0} > 0 \end{cases}.$$

In the formulas, tz is a transient-state duration of the single-phase-to-ground fault, taking 2 ms, $i_0$ is a zero-sequence current sampling value, $u_0$ is a zero-sequence voltage sampling value, $\dot{I}_0$ is a zero-sequence current vector, and $\dot{U}_0$ is a zero-sequence voltage vector.

In order to achieve the above objective, the present disclosure further provides a single-phase-to-ground protection system for an active power distribution network. The system includes:

an active power calculation module configured to calculate active power P of a line after a three-phase voltage, a three-phase current, a zero-sequence voltage and a zero-sequence current of the line are acquired in real time by means of a power distribution terminal;

an active power curve generation module configured to record and store the active power of a line at a fixed time interval $T_{smp}$ to form an active power curve $P_i$;

a data statistics module configured to perform data statistics according to the active power curve, where statistical data include average daily active power, average night active power, all-day positive active time, all-day reverse active time, night positive active time and night reverse active time;

a compensation coefficient calculation module configured to calculate a single-phase-to-ground protection action direction compensation coefficient $D_p$ and a zero-sequence current compensation coefficient $k_{i0}$ on the basis of the statistical data; and a fault determination protection module configured to detect whether a single-phase-to-ground fault occurs to the line, where when the single-phase-to-ground fault occurs to the line, a transient-state zero-sequence direction and a steady-state zero-sequence direction are compensated by using the single-phase-to-ground protection action direction compensation coefficient $D_p$, or a zero-sequence current is compensated by using the zero-sequence current compensation coefficient $k_{i0}$, it is determined that the single-phase-to-ground fault occurs to the line when compensation results satisfy action conditions of the single-phase-to-ground protection, and the power distribution terminal trips or gives an alarm after delay.

In order to achieve the above objective, the present disclosure further provides an electronic device. The electronic device includes a processor, a memory, and a computer program which is stored on the memory and is runnable on the processor. When the computer program is executed by the processor, the above-mentioned single-phase-to-ground protection method for an active power distribution network is implemented.

In order to achieve the above objective, the present disclosure further provides a computer readable storage medium. A computer program is stored in the computer readable storage medium, and when the computer program is executed by a processor, the above-mentioned single-phase-to-ground protection method for an active power distribution network is implemented.

According to the solution of the present disclosure, in the present disclosure, statistics are performed on the active power data of the line, the action direction of the single-phase-to-ground protection or the zero-sequence current is compensated on the basis of the statistical data, and single-phase-to-ground fault determination is performed by utilizing the compensated data, such that the determination accuracy is improved.

According to the solution of the present disclosure, when the single-phase-to-ground fault occurs, the power distribution terminal calculates the transient zero-sequence power direction and the steady-state zero-sequence power direction by combining the action direction compensation coefficient or the zero-sequence current compensation coefficient. When the zero-sequence power direction satisfies the action conditions, it is determined that the single-phase-to-ground fault occurs downstream of the line, and the power distribution terminal trips or gives an alarm after delay. The present disclosure can be self-adaptive to the change of the operation mode of the power distribution line, influence of the access of a distributed power supply on the single-phase-to-ground protection of the power distribution terminal is overcome, demands of building the active power distribution network are satisfied, and quite significant engineering application value is achieved. This method can adapt to a development trend of access of large-scale distributed power supplies and assist in building of the power system.

According to the solution of the present disclosure, the present disclosure can adapt to access of high-proportion distributed power supplies, improve accuracy of the single-phase-to-ground protection, and satisfy demands of building the active power distribution network.

DETAILED DESCRIPTION OF THE EMBODIMENTS

The contents of the present disclosure will now be described with reference to exemplary embodiments. It should be understood that the embodiments described are merely intended to enable those of ordinary skill in the art to better understand and thus implement the contents of the present disclosure, and do not imply any limitation as to the scope of the present disclosure.

As used herein, the terms "include" and variants thereof are to be interpreted as open-ended terms meaning "including but not limited to". The term "on the basis of" is to be read as "at least partially on the basis". The terms "one embodiment" and "an embodiment" are to be read as "at least one embodiment".

Figure 1:
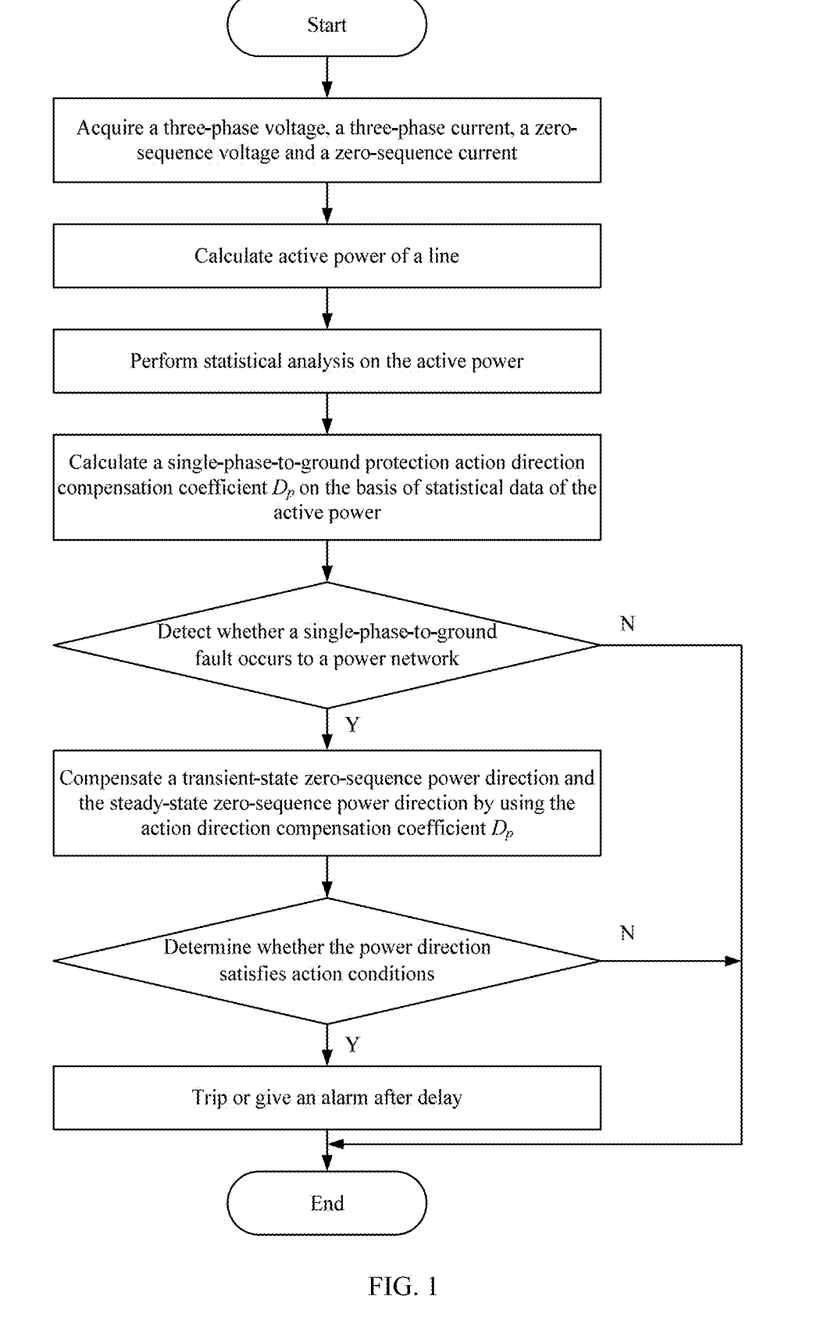
FIG. 1 schematically shows a flowchart of a single-phase-to-ground protection method for an active power distribution network provided by an embodiment of the present disclosure.

FIG. 1 schematically shows a flowchart of the single-phase-to-ground protection method for an active power distribution network provided by an embodiment of the present disclosure. As shown in FIG. 1, in this embodiment, a single-phase-to-ground protection method for an active power distribution network is provided, where a power distribution terminal compensates the positive direction of an action of single-phase-to-ground protection by utilizing statistical data of active power of a line, and determines the single-phase-to-ground fault according to the compensated positive direction of the action, which specifically includes:

acquire a three-phase voltage, a three-phase current, a zero-sequence voltage and a zero-sequence current of the line in real time by the power distribution terminal, and calculate the active power P of the line;

record and store the active power of the line at a fixed time interval $T_{smp}$ to form an active power curve $P_i$ (i=1, 2, 3, . . . );

perform data statistics according to the active power curve, where statistical data include average daily active power, average night active power, all-day positive active time, all-day reverse active time, night positive active time and night reverse active time;

calculate a single-phase-to-ground protection action direction compensation coefficient $D_p$ on the basis of the statistical data; and detect whether a single-phase-to-ground fault occurs to the line is detected, where when the single-phase-to-ground fault occurs to the line, a transient-state zero-sequence direction and a steady-state zero-sequence direction are calculated on the basis of the zero-sequence voltage and the zero-sequence current, the transient-state zero-sequence direction and the steady-state zero-sequence direction are compensated by using the single-phase-to-ground protection action direction compensation coefficient $D_p$, when the compensated zero-sequence power direction satisfies the action conditions of the single-phase-to-ground protection, it is determined that the single-phase-to-ground fault occurs to the line, and the power distribution terminal trips or gives an alarm after delay.

Based on the above solution, the single-phase-to-ground protection action direction compensation coefficient $D_p$ includes:

The single-phase-to-ground protection action direction compensation coefficient $D_p$ is the average daily active power $P_{av}$ of the line:

$$D_P = P_{av} = \frac{1}{N}\sum_{i=1}^{N} P_i.$$

In the formula, N is the number of active power curve points recorded by the power distribution terminal within 24 hours.

The single-phase-to-ground protection action direction compensation coefficient $D_p$ is the average night active power $P_{av\_n}$ of the line:

$$D_P = P_{av\_n} = \frac{1}{k2-k1}\sum_{i=k1}^{k2} P_i.$$

In the formula, k1 is a night start point of the active power curve, and k2 is a night end point of the active power curve.

The single-phase-to-ground protection action direction compensation coefficient $D_p$ is a difference between the all-day positive active time and the all-day reverse active time:

$$D_P = T_{smp} * \left(\sum_{i=1}^{N}(P_i > 0) - \sum_{i=1}^{N}(P_i < 0)\right).$$

The single-phase-to-ground protection action direction compensation coefficient $D_p$ is a difference between the night positive active time and the night reverse active time:

$$D_P = T_{smp} * \left(\sum_{i=k1}^{k2}(P_i > 0) - \sum_{i=k1}^{k2}(P_i < 0)\right).$$

Based on an embodiment of the present disclosure, the action conditions of the single-phase-to-ground protection are:

The compensated transient-state zero-sequence power direction or the steady-state zero-sequence power direction is positive, and at least one of the following formulas is satisfied:

$$\begin{cases} D_p * \int_0^{tz} i_0 * u_0 > 0 \\ D_p * \cos\dfrac{\dot{U}_0}{\dot{I}_0} > 0 \end{cases}.$$

In the formulas, tz is a transient-state duration of the single-phase-to-ground fault, taking 2 ms, $i_0$ is a zero-sequence current sampling value, $u_0$ is a zero-sequence voltage sampling value, $\dot{I}_0$ is a zero-sequence current vector, and $\dot{U}_0$ is a zero-sequence voltage vector.

Figure 2:
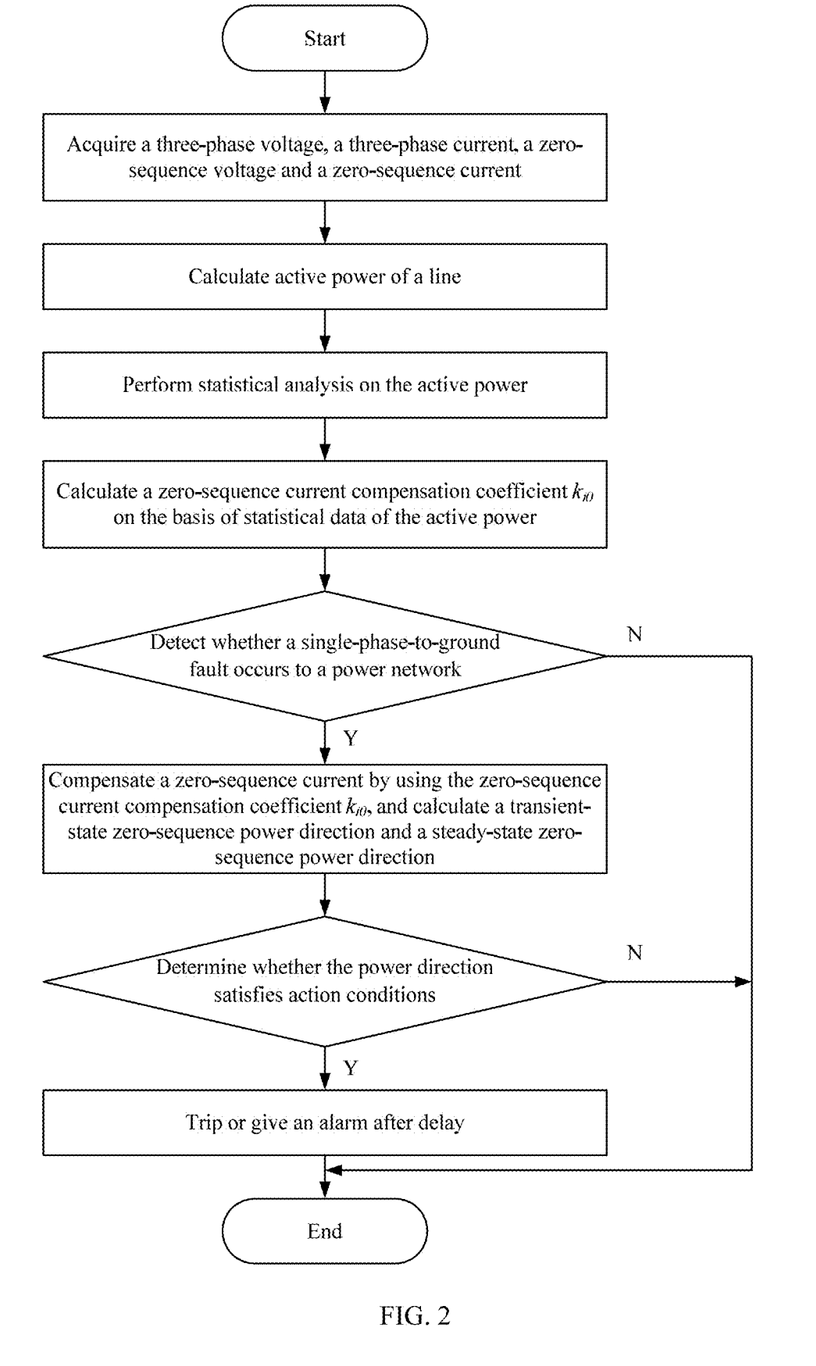
FIG. 2 schematically shows a flowchart of a single-phase-to-ground protection method for an active power distribution network provided by another embodiment of the present disclosure.

Further, FIG. 2 schematically shows a flowchart of the single-phase-to-ground protection method for an active power distribution network provided by another embodiment of the present disclosure. As shown in FIG. 2, in this embodiment, a single-phase-to-ground protection method for an active power distribution network is provided, where a power distribution terminal compensates a zero-sequence current by utilizing statistical data of active power of a line, and determines the single-phase-to-ground fault according to the compensated zero-sequence current, which specifically includes:

acquire a three-phase voltage, a three-phase current, a zero-sequence voltage and a zero-sequence current of the line in real time by the power distribution terminal, and calculate the active power P of the line;

record and store the active power of the line at a fixed time interval $T_{smp}$ to form an active power curve $P_i$ (i=1, 2, 3, ... );

perform data statistics according to the active power curve, where statistical data include average daily active power, average night active power, all-day positive active time, all-day reverse active time, night positive active time and night reverse active time;

calculate a zero-sequence current compensation coefficient $k_{i0}$ on the basis of the statistical data; and detect whether a single-phase-to-ground fault occurs to the line, where when the single-phase-to-ground fault occurs to the line, the zero-sequence current is compensated according to the zero-sequence current compensation coefficient $k_{i0}$, transient-state zero-sequence power and steady-state zero-sequence reactive power are calculated on the basis of the compensated zero-sequence current and zero-sequence voltage, when the transient-state zero-sequence power or the steady-state zero-sequence reactive power is greater than zero, it is determined that the single-phase-to-ground fault occurs to the line, and the power distribution terminal trips or gives an alarm after delay.

In this embodiment, when the average daily active power of the line is negative, the zero-sequence current compensation coefficient $k_{i0}$ takes a value of −1, otherwise, the zero-sequence current compensation coefficient $k_{i0}$ takes a value of 1:

$$k_{i0} = \begin{cases} 1, \dfrac{1}{N}\sum_{i=1}^{N} P_i > 0 \\ -1, \dfrac{1}{N}\sum_{i=1}^{N} P_i < 0 \end{cases}.$$

In the formula, N is the number of active power curve points recorded by the power distribution terminal within 24 hours.

In this embodiment, when the average night active power of the line is negative, the zero-sequence current compensation coefficient $k_{i0}$ takes a value of −1, otherwise, the zero-sequence current compensation coefficient $k_{i0}$ takes a value of 1:

$$k_{i0} = \begin{cases} 1, & \frac{1}{k2-k1}\sum_{i=k1}^{k2} P_i > 0 \\ -1, & \frac{1}{k2-k1}\sum_{i=k1}^{k2} P_i < 0 \end{cases}.$$

In the formula, k1 is a night start point of the active power curve, and k2 is a night end point of the active power curve.

In this embodiment, when the all-day reverse active time is greater than the all-day positive active time, the zero-sequence current compensation coefficient $k_{i0}$ takes a value of −1, otherwise, the zero-sequence current compensation coefficient $k_{i0}$ takes a value of 1:

$$k_{i0} = \begin{cases} 1, & \sum_{i=1}^{N}(P_i > 0) > \sum_{i=1}^{N}(P_i > 0) \\ -1, & \sum_{i=1}^{N}(P_i < 0) < \sum_{i=1}^{N}(P_i > 0) \end{cases}.$$

In this embodiment, when the night reverse active time is greater than the night positive active time, the zero-sequence current compensation coefficient $k_{i0}$ takes a value of −1, otherwise, the zero-sequence current compensation coefficient $k_{i0}$ takes a value of 1:

$$k_{i0} = \begin{cases} 1, & \sum_{i=k1}^{k2}(P_i > 0) > \sum_{i=k1}^{k2}(P_i < 0) \\ -1, & \sum_{i=k1}^{k2}(P_i > 0) < \sum_{i=k1}^{k2}(P_i < 0) \end{cases}.$$

In the formula, k1 is a night start point of the active power curve, and k2 is a night end point of the active power curve.

In this embodiment, the action conditions of the single-phase-to-ground protection are: the transient-state zero-sequence power or the steady-state zero-sequence reactive power calculated on the basis of the compensated zero-sequence current and zero-sequence voltage is greater than zero, and at least one of the following formulas is satisfied:

$$\begin{cases} \int_0^{tz} k_{i0} * i_0 * u_0 > 0 \\ \cos\frac{\dot{U}_0}{k_{i0} * \dot{I}_0} > 0 \end{cases}.$$

In the formulas, tz is a transient-state duration of the single-phase-to-ground fault, taking 2 ms, $i_0$ is a zero-sequence current sampling value, $u_0$ is a zero-sequence voltage sampling value, $\dot{I}_0$ is a zero-sequence current vector, and $\dot{U}_0$ is a zero-sequence voltage vector.

According to the above solution of the present disclosure, the present disclosure provides the single-phase-to-ground protection method for an active power distribution network. Statistics are performed on the active power data of the line, the action direction of the single-phase-to-ground protection or the zero-sequence current is compensated on the basis of the statistical data, and single-phase-to-ground fault determination is performed by utilizing the compensated data, such that the determination accuracy is improved.

According to the single-phase-to-ground protection method for an active power distribution network solution provided by the present disclosure, when the single-phase-to-ground fault occurs, the power distribution terminal calculates the transient zero-sequence power direction and the steady-state zero-sequence power direction by combining the action direction compensation coefficient or the zero-sequence current compensation coefficient. When the zero-sequence power direction satisfies the action conditions, it is determined that the single-phase-to-ground fault occurs downstream of the line, and the power distribution terminal trips or gives an alarm after delay. The present disclosure can be self-adaptive to the change of the operation mode of the power distribution line, influence of the access of a distributed power supply on the single-phase-to-ground protection of the power distribution terminal is overcome, demands of building the active power distribution network are satisfied, and quite significant engineering application value is achieved. This method can adapt to the development trend of access of large-scale distributed power supplies and assist in building of the power system.

To achieve the above objective, the present disclosure further provides a single-phase-to-ground protection system for an active power distribution network, where a power distribution terminal compensates the positive direction of an action of single-phase-to-ground protection by utilizing statistical data of active power of a line, and determines the single-phase-to-ground fault according to the compensated positive direction of the action. The system specifically includes:

an active power calculation module configured to calculate active power P of the line after a three-phase voltage, a three-phase current, a zero-sequence voltage and a zero-sequence current of the line are acquired in real time by the power distribution terminal;

an active power curve generation module configured to record and store the active power of a line at a fixed time interval $T_{smp}$ to form an active power curve $P_i$ (i=1, 2, 3, . . . );

a data statistics module configured to perform data statistics according to the active power curve, where statistical data include average daily active power, average night active power, all-day positive active time, all-day reverse active time, night positive active time and night reverse active time;

a compensation coefficient calculation module configured to calculate a single-phase-to-ground protection action direction compensation coefficient $D_p$ on the basis of the statistical data; and a fault determination protection module configured to detect whether a single-phase-to-ground fault occurs to the line, where when the single-phase-to-ground fault occurs to the line, a transient-state zero-sequence direction and a steady-state zero-sequence direction are calculated on the basis of the zero-sequence voltage and the zero-sequence current, the transient-state zero-sequence direction and the steady-state zero-sequence direction are compensated by using the single-phase-to-ground protection action direction compensation coefficient $D_p$, when the compensated zero-sequence power direction satisfies the action conditions of the single-phase-to-ground protection, it is determined that the single-phase-to-ground fault occurs to the line, and the power distribution terminal trips or gives an alarm after delay.

Based on the above solution, the single-phase-to-ground protection action direction compensation coefficient $D_p$ includes:

The single-phase-to-ground protection action direction compensation coefficient $D_p$ is the average daily active power $P_{av}$ of the line:

$$D_P = P_{av} = \frac{1}{N}\sum_{i=1}^{N} P_i.$$

In the formula, N is the number of active power curve points recorded by the power distribution terminal within 24 hours.

The single-phase-to-ground protection action direction compensation coefficient $D_p$ is the average night active power $P_{av\_n}$ of the line:

$$D_P = P_{av\_n} = \frac{1}{k2-k1}\sum_{i=k1}^{k2} P_i.$$

In the formula, k1 is a night start point of the active power curve, and k2 is a night end point of the active power curve.

The single-phase-to-ground protection action direction compensation coefficient $D_p$ is a difference between the all-day positive active time and the all-day reverse active time:

$$D_P = T_{smp} * \left(\sum_{i=1}^{N}(P_i > 0) - \sum_{i=1}^{N}(P_i < 0)\right).$$

The single-phase-to-ground protection action direction compensation coefficient $D_p$ is a difference between the night positive active time and the night reverse active time:

$$D_P = T_{smp} * \left(\sum_{i=k1}^{k2}(P_i > 0) - \sum_{i=k1}^{k2}(P_i < 0)\right).$$

Based on an embodiment of the present disclosure, the action conditions of the single-phase-to-ground protection are:

the compensated transient-state zero-sequence power direction or the steady-state zero-sequence power direction is positive, and at least one of the following formulas is satisfied:

$$\begin{cases} D_P * \int_0^{tz} i_0 * u_0 > 0 \\ D_P * \cos\dfrac{\dot{U}_0}{k_{i0} * \dot{I}_0} > 0 \end{cases}.$$

In the formulas, tz is a transient-state duration of the single-phase-to-ground fault, taking 2 ms, $i_0$ is a zero-sequence current sampling value, $u_0$ is a zero-sequence voltage sampling value, $\dot{I}_0$ is a zero-sequence current vector, and $\dot{U}_0$ is a zero-sequence voltage vector.

Further, the present disclosure further provides a single-phase-to-ground protection system for an active power distribution network, where a power distribution terminal compensates a zero-sequence current by utilizing statistical data of active power of a line, and determines the single-phase-to-ground fault according to the compensated zero-sequence current. The system specifically includes:

an active power calculation module configured to calculate active power P of the line after a three-phase voltage, a three-phase current, a zero-sequence voltage and a zero-sequence current of the line are acquired in real time by the power distribution terminal;

an active power curve generation module configured to record and store the active power of a line at a fixed time interval $T_{smp}$ to form an active power curve $P_i$ (i=1, 2, 3, . . . );

a data statistics module configured to perform data statistics according to the active power curve, where statistical data include average daily active power, average night active power, all-day positive active time, all-day reverse active time, night positive active time and night reverse active time;

a compensation coefficient calculation module configured to calculate a zero-sequence current compensation coefficient $k_{i0}$ on the basis of the statistical data; and a fault determination protection module configured to detect whether a single-phase-to-ground fault occurs to the line, where when the single-phase-to-ground fault occurs to the line, the zero-sequence current is compensated according to the zero-sequence current compensation coefficient $k_{i0}$, transient-state zero-sequence power and steady-state zero-sequence reactive power are calculated on the basis of the compensated zero-sequence current and zero-sequence voltage, when the transient-state zero-sequence power or the steady-state zero-sequence reactive power is greater than zero, it is determined that the single-phase-to-ground fault occurs to the line, and the power distribution terminal trips or gives an alarm after delay.

In this embodiment, when the average daily active power of the line is negative, the zero-sequence current compensation coefficient $k_{i0}$ takes a value of −1, otherwise, the zero-sequence current compensation coefficient $k_{i0}$ takes a value of 1:

$$k_{i0} = \begin{cases} 1, \dfrac{1}{N}\sum_{i=1}^{N} P_i > 0 \\ -1, \dfrac{1}{N}\sum_{i=1}^{N} P_i < 0 \end{cases}.$$

In the formula, N is the number of active power curve points recorded by the power distribution terminal within 24 hours.

In this embodiment, when the average night active power of the line is negative, the zero-sequence current compensation coefficient $k_{i0}$ takes a value of −1, otherwise, the zero-sequence current compensation coefficient $k_{i0}$ takes a value of 1:

$$k_{i0} = \begin{cases} 1, & \frac{1}{k2-k1}\sum_{i=k1}^{k2} P_i > 0 \\ -1, & \frac{1}{k2-k1}\sum_{i=k1}^{k2} P_i < 0 \end{cases}.$$

In the formula, k1 is a night start point of the active power curve, and k2 is a night end point of the active power curve.

In this embodiment, when the all-day reverse active time is greater than the all-day positive active time, the zero-sequence current compensation coefficient $k_{i0}$ takes a value of $-1$, otherwise, the zero-sequence current compensation coefficient $k_{i0}$ takes a value of 1:

$$k_{i0} = \begin{cases} 1, & \sum_{i=1}^{N}(P_i > 0) > \sum_{i=1}^{N}(P_i < 0) \\ -1, & \sum_{i=1}^{N}(P_i > 0) < \sum_{i=1}^{N}(P_i < 0) \end{cases}.$$

In this embodiment, when the night reverse active time is greater than the night positive active time, the zero-sequence current compensation coefficient $k_{i0}$ takes a value of $-1$, otherwise, the zero-sequence current compensation coefficient $k_{i0}$ takes a value of 1:

$$k_{i0} = \begin{cases} 1, & \sum_{i=k1}^{k2}(P_i > 0) > \sum_{i=k1}^{k2}(P_i < 0) \\ -1, & \sum_{i=k1}^{k2}(P_i > 0) < \sum_{i=k1}^{k2}(P_i < 0) \end{cases}.$$

In the formula, k1 is a night start point of the active power curve, and k2 is a night end point of the active power curve.

In this embodiment, the action conditions of the single-phase-to-ground protection are: the transient-state zero-sequence power or the steady-state zero-sequence reactive power calculated on the basis of the compensated zero-sequence current and zero-sequence voltage is greater than zero, and at least one of the following formulas is satisfied:

$$\begin{cases} \int_0^{tz} k_{i0} * i_0 * u_0 > 0 \\ \cos\frac{\dot{U}_0}{k_{i0} * \dot{I}_0} > 0 \end{cases}.$$

In the formulas, tz is a transient-state duration of the single-phase-to-ground fault, taking 2 ms, $i_0$ is a zero-sequence current sampling value, $u_0$ is a zero-sequence voltage sampling value, $\dot{I}_0$ is a zero-sequence current vector, and $\dot{U}_0$ the is a zero-sequence voltage vector.

According to the above solution of the present disclosure, the present disclosure provides the single-phase-to-ground protection system for an active power distribution network. Statistics are performed on the active power data of the line, the action direction of the single-phase-to-ground protection or the zero-sequence current is compensated on the basis of the statistical data, and single-phase-to-ground fault determination is performed by utilizing the compensated data, such that the determination accuracy is improved.

According to the single-phase-to-ground protection system for an active power distribution network provided by the present disclosure, when the single-phase-to-ground fault occurs, the power distribution terminal calculates the transient zero-sequence power direction and the steady-state zero-sequence power direction by combining the action direction compensation coefficient or the zero-sequence current compensation coefficient. When the zero-sequence power direction satisfies the action conditions, it is determined that the single-phase-to-ground fault occurs downstream of the line, and the power distribution terminal trips or gives an alarm after delay. The present disclosure can be self-adaptive to the change of the operation mode of the power distribution line, influence of the access of a distributed power supply on the single-phase-to-ground protection of the power distribution terminal is overcome, demands of building the active power distribution network are satisfied, and quite significant engineering application value is achieved. This method can adapt to the development trend of access of large-scale distributed power supply and assist in building of the power system.

In order to achieve the above objective, the present disclosure further provides an electronic device. The electronic device includes a processor, a memory, and a computer program stored on the memory. When the computer program is executed by the processor, the above-mentioned single-phase-to-ground protection method for an active power distribution network is implemented.

In order to achieve the above objective, the present disclosure further provides a computer readable storage medium. A computer program is stored in the computer readable storage medium, and when the computer program is executed by a processor, the above-mentioned single-phase-to-ground protection method for an active power distribution network is implemented.

According to the above solution of the present disclosure, the present disclosure can adapt to access of high-proportion distributed power supplies, improve accuracy of the single-phase-to-ground protection, and satisfy demands of building the active power distribution network.

Those of ordinary skill in the art may appreciate that the modules and algorithm steps described in combination with the embodiments disclosed herein can be implemented in electronic hardware, or a combination of computer software and electronic hardware. Whether these functions are performed in electronic hardware or software depends on the specific application and design constraints of the technical solution. Those skilled in the art can use different methods to implement the described functions for each particular application, but such implementation should not be considered to be beyond the scope of the present disclosure.

Those skilled in the art can clearly understand that, for convenience and brevity of description, specific working processes of the above-described apparatus and device may refer to corresponding processes in the foregoing method embodiments, and are not repeated herein.

In the embodiments provided by the present disclosure, it should be understood that the disclosed apparatus and method may be implemented in other ways. For example, the apparatus embodiments described above are merely schematic. For example, division of modules is merely a kind of division of logic functions, there may be other division modes in actual implementation, and for example, a plurality of modules or assemblies may be combined or integrated into another system, or some features may be omitted or not conducted. Furthermore, shown or discussed coupling or direct coupling or communication connection between each other may be an indirect coupling or communication connection by means of an interface, an apparatus or a module, and may be in an electrical, mechanical or other form.

The module described as a separable part may be physically separated or not, and a part shown as a module may be a physical module or not, that is, may be located at one place or may also be distributed on a plurality of network modules. Part or all of the modules may be selected according to actual needs to achieve the objective of the solution of the embodiments of the present disclosure.

In addition, the functional modules in the embodiments of the present disclosure may be integrated into one processing module, or each module may be physically present separately, or two or more modules may be integrated into the one module.

If the functions are implemented in the form of the software functional modules and sold or used as independent products, they may be stored in a computer readable storage medium. On the basis of such understanding, the technical solution of the present disclosure, in essence or from the view of part contributing to the prior art, or part of the technical solution may be embodied in the form of a computer software product that is stored in a storage medium and includes a plurality of instructions configured to make one computer device (which may be a personal computer, a server or a network device, etc.) conduct all or part of the steps of the single-phase-to-ground protection method for an active power distribution network in each of the embodiments of the present disclosure. The foregoing storage medium includes various media which may store program codes, such as a universal serial bus flash drive, a mobile hard disk drive, a read-only memory (ROM), a random access memory (RAM), a diskette and an optical disk.

The above description is merely illustrative of preferred embodiments of the present disclosure and of principles of the technology employed. It should be understood by those skilled in the art that the scope of the invention referred to in the present disclosure is not limited to the technical solutions in which the above-described technical features are specifically combined, but also encompasses other technical solutions in which the above-described technical features or equivalent features thereof are arbitrarily combined without departing from the inventive concept, For example, technical solutions formed by interchanging the features described above with (but not limited to) technical features disclosed in the present disclosure that have similar functions.

It should be understood that the sequence number of each step in the contents of the present disclosure and the embodiments of the present disclosure does not absolutely mean the order of execution, and the execution order of each process should be determined by its function and internal logic, and should not constitute any limitation on the implementation process of the embodiments of the present disclosure.

What is claimed is:

1. A single-phase-to-ground protection method for an active power distribution network, comprising the following steps:
   acquiring a three-phase voltage, a three-phase current, a zero-sequence voltage and a zero-sequence current of a line in real time from a power distribution terminal, and calculating active power P of the line;
   recording and storing the active power of the line at a fixed time interval $T_{smp}$ to form an active power curve $P_i$;
   calculating statistical data according to the active power curve, wherein the statistical data comprise average daily active power, average night active power, all-day positive active time, all-day reverse active time, night positive active time and night reverse active time;
   calculating a single-phase-to-ground protection action direction compensation coefficient $D_p$ and a zero-sequence current compensation coefficient $k_{i0}$ on the basis of the statistical data; and
   detecting whether a single-phase-to-ground fault occurs to the line, wherein when the single-phase-to-ground fault occurs to the line, a transient-state zero-sequence direction and a steady-state zero-sequence direction are compensated by using the single-phase-to-ground protection action direction compensation coefficient $D_p$, or the zero-sequence current is compensated by using the zero-sequence current compensation coefficient $k_{i0}$, it is determined that the single-phase-to-ground fault occurs to the line when compensation results satisfy action conditions of the single-phase-to-ground protection, and the power distribution terminal trips or gives an alarm after delay.

2. The single-phase-to-ground protection method for an active power distribution network according to claim 1, wherein whether a single-phase-to-ground fault occurring to the line is detected, when the single-phase-to-ground fault occurs to the line, a transient-state zero-sequence direction and a steady-state zero-sequence direction are calculated on the basis of the zero-sequence voltage and the zero-sequence current, and the transient-state zero-sequence direction and the steady-state zero-sequence direction are compensated by using the single-phase-to-ground protection action direction compensation coefficient $D_p$; and when a compensated transient-state zero-sequence direction and a compensated steady-state zero-sequence direction satisfies predefined action conditions of the single-phase-to-ground protection, it is determined that the single-phase-to-ground fault occur to the line, and the power distribution terminal trips or gives an alarm after delay.

3. The single-phase-to-ground protection method for an active power distribution network according to claim 1, wherein the single-phase-to-ground protection action direction compensation coefficient $D_p$ is the average daily active power $P_{av}$ of the line:

$$D_P = P_{av} = \frac{1}{N}\sum_{i=1}^{N} P_i$$

in the formula, N is the number of active power curve points recorded by the power distribution terminal within 24 hours.

4. The single-phase-to-ground protection method for an active power distribution network according to claim 1, wherein the single-phase-to-ground protection action direction compensation coefficient $D_p$ is the average night active power $P_{av\_n}$ of the line:

$$D_P = P_{av\_n} = \frac{1}{k2-k1}\sum_{i=k1}^{k2} P_i$$

in the formula, k1 is a night start point of the active power curve, and k2 is a night end point of the active power curve.

5. The single-phase-to-ground protection method for an active power distribution network according to claim 1, wherein the single-phase-to-ground protection action direction compensation coefficient $D_p$ is a difference between the all-day positive active time and the all-day reverse active time:

$$D_P = T_{smp} * \left( \sum_{i=1}^{N} (P_i > 0) - \sum_{i=1}^{N} (P_i < 0) \right).$$

6. The single-phase-to-ground protection method for an active power distribution network according to claim 1, wherein the single-phase-to-ground protection action direction compensation coefficient $D_p$ is a difference between the night positive active time and the night reverse active time:

$$D_P = T_{smp} * \left( \sum_{i=k1}^{k2} (P_i > 0) - \sum_{i=k1}^{k2} (P_i < 0) \right).$$

7. The single-phase-to-ground protection method for an active power distribution network according to claim 1, wherein predefined action conditions of the single-phase-to-ground protection are:

the compensated transient-state zero-sequence power direction or the steady-state zero-sequence power direction is positive, and at least one of the following formulas is satisfied:

$$\begin{cases} D_P * \int_0^{tz} i_0 * u_0 > 0 \\ D_P * \cos \dfrac{\dot{U}_0}{\dot{I}_0} > 0 \end{cases}$$

in the formulas, tz is a transient-state duration of the single-phase-to-ground fault, taking 2 ms, $i_0$ is a zero-sequence current sampling value, $u_0$ is a zero-sequence voltage sampling value, $\dot{I}_0$ is a zero-sequence current vector, and $\dot{U}_0$ is a zero-sequence voltage vector.

8. The single-phase-to-ground protection method for an active power distribution network according to claim 1, wherein whether a single-phase-to-ground fault occurring to the line is detected, when the single-phase-to-ground fault occurs to the line, the zero-sequence current is compensated according to the zero-sequence current compensation coefficient $k_{i0}$, and the transient-state zero-sequence power and steady-state zero-sequence reactive power are calculated on the basis of the compensated zero-sequence current and zero-sequence voltage; and when the transient-state zero-sequence power or the steady-state zero-sequence reactive power is greater than zero, it is determined that the single-phase-to-ground fault occurs to the line, and the power distribution terminal trips or gives an alarm after delay.

9. The single-phase-to-ground protection method for an active power distribution network according to claim 1, wherein when the average daily active power of the line is negative, the zero-sequence current compensation coefficient $k_{i0}$ takes a value of −1, otherwise, the zero-sequence current compensation coefficient $k_{i0}$ takes a value of 1:

$$k_{i0} = \begin{cases} 1, & \dfrac{1}{N}\sum_{i=1}^{N} P_i > 0 \\ -1, & \dfrac{1}{N}\sum_{i=1}^{N} P_i < 0 \end{cases}$$

in the formula, N is the number of active power curve points recorded by the power distribution terminal within 24 hours.

10. The single-phase-to-ground protection method for an active power distribution network according to claim 1, wherein when the average night active power of the line is negative, the zero-sequence current compensation coefficient $k_{i0}$ takes a value of −1, otherwise, the zero-sequence current compensation coefficient $k_{i0}$ takes a value of 1:

$$k_{i0} = \begin{cases} 1, & \dfrac{1}{k2-k1}\sum_{i=k1}^{k2} P_i > 0 \\ -1, & \dfrac{1}{k2-k1}\sum_{i=k1}^{k2} P_i < 0 \end{cases}$$

in the formula, k1 is a night start point of the active power curve, and k2 is a night end point of the active power curve.

11. The single-phase-to-ground protection method for an active power distribution network according to claim 1, wherein when the all-day reverse active time is greater than the all-day positive active time, the zero-sequence current compensation coefficient $k_{i0}$ takes a value of −1, otherwise, the zero-sequence current compensation coefficient $k_{i0}$ takes a value of 1:

$$k_{i0} = \begin{cases} 1, & \dfrac{1}{N}\sum_{i=1}^{N}(P_i > 0) > \sum_{i=1}^{N}(P_i < 0) \\ -1, & \sum_{i=1}^{N}(P_i > 0) < \sum_{i=1}^{N}(P_i < 0) \end{cases}.$$

12. The single-phase-to-ground protection method for an active power distribution network according to claim 1, wherein when the night reverse active time is greater than the night positive active time, the zero-sequence current compensation coefficient $k_{i0}$ takes a value of −1, otherwise, the zero-sequence current compensation coefficient $k_{i0}$ takes a value of 1:

$$k_{i0} = \begin{cases} 1, & \sum_{i=k1}^{k2}(P_i > 0) > \sum_{i=k1}^{k2}(P_i < 0) \\ -1, & \sum_{i=k1}^{k2}(P_i > 0) < \sum_{i=k1}^{k2}(P_i < 0) \end{cases}$$

in the formula, k1 is a night start point of the active power curve, and k2 is a night end point of the active power curve.

13. The single-phase-to-ground protection method for an active power distribution network according to claim 1, wherein predefined action conditions of the single-phase-to-ground protection are: the transient-state zero-sequence power or the steady-state zero-sequence reactive power calculated on the basis of the compensated zero-sequence current and zero-sequence voltage is greater than zero, and at least one of the following formulas is satisfied:

$$\begin{cases} \int_0^{tz} k_{i0} * i_0 * u_0 > 0 \\ \cos\dfrac{\dot{U}_0}{k_{i0} * \dot{I}_0} > 0 \end{cases}$$

in the formulas, tz is a transient-state duration of the single-phase-to-ground fault, taking 2 ms, $i_0$ is a zero-sequence current sampling value, $u_0$ is a zero-sequence voltage sampling value, $\dot{I}_0$ is a zero-sequence current vector, and $\dot{U}_0$ is a zero-sequence voltage vector.

14. An electronic device, comprising: a processor, a memory, and a computer program which is stored on the memory and is runnable on the processor, wherein when the computer program is executed by the processor, the single-phase-to-ground protection method for an active power distribution network according to claim 1 is implemented.

15. A non-transitory computer readable storage medium, wherein a computer program is stored in the computer readable storage medium, and when the computer program is executed by a processor, the single-phase-to-ground protection method for an active power distribution network according to claim 1 is implemented.

16. A single-phase-to-ground protection system for an active power distribution network, comprising:
an active power calculation module configured to calculate active power P of a line after a three-phase voltage, a three-phase current, a zero-sequence voltage and a zero-sequence current of the line are acquired in real time from a power distribution terminal;
an active power curve generation module configured to record and store the active power of a line at a fixed time interval $T_{smp}$ to form an active power curve $P_i$;
a data statistics module configured to calculate statistical data according to the active power curve, wherein the statistical data comprise average daily active power, average night active power, all-day positive active time, all-day reverse active time, night positive active time and night reverse active time;
a compensation coefficient calculation module configured to calculate a single-phase-to-ground protection action direction compensation coefficient $D_p$ and a zero-sequence current compensation coefficient $k_{i0}$ on the basis of the statistical data; and
a fault determination protection module configured to detect whether a single-phase-to-ground fault occurs to the line, where when the single-phase-to-ground fault occurs to the line, a transient-state zero-sequence direction and a steady-state zero-sequence direction are compensated by using the single-phase-to-ground protection action direction compensation coefficient $D_p$, or a zero-sequence current is compensated by using the zero-sequence current compensation coefficient $k_{i0}$, it is determined that the single-phase-to-ground fault occurs to the line when compensation results satisfy action conditions of the single-phase-to-ground protection, and the power distribution terminal trips or gives an alarm after delay.

\* \* \* \* \*